United States Patent [19]
Heeren

[11] 3,944,848
[45] Mar. 16, 1976

[54] VOLTAGE SENSITIVE ISOLATION FOR STATIC LOGIC CIRCUIT

[75] Inventor: Richard H. Heeren, Palatine, Ill.

[73] Assignee: Teletype Corporation, Skokie, Ill.

[22] Filed: Dec. 23, 1974

[21] Appl. No.: 535,266

[52] U.S. Cl. ................ 307/205; 307/214; 307/215; 307/251; 307/270
[51] Int. Cl.² .............. H03K 19/08; H03K 19/36; H03K 19/34; H03K 17/04
[58] Field of Search .......... 307/205, 214, 215, 251, 307/304, 270

[56] References Cited
UNITED STATES PATENTS

| | | | |
|---|---|---|---|
| 3,601,627 | 8/1971 | Booher | 307/205 |
| 3,631,261 | 12/1971 | Heimbigner | 307/205 X |

OTHER PUBLICATIONS

DeSimone, "Low–Power MOSFET Decoder"; IBM Tech. Discl. Bull; Vol. 13, No. 1, pp. 260–261; 6/1970.
Reynolds et al., "Metal–Oxide–Semiconductor (MOS) Integrated Circuits"; Post. Off. Elect. Engrs. Jour. (G.B.), Vol. 63, pt. 2(7/1970); pp. 105–112.
West, "Practical Circuit Design Using M.O.S."; Design Electronics (p46); pp. 30–32, 37–38; 3/1971.
Fette, "Dynamic MOS –a logical choice", EDN/EEE (pub.); pp. ch(7–14); 11/15/1971.

*Primary Examiner*—Stanley D. Miller, Jr.
*Assistant Examiner*—L. N. Anagnos
*Attorney, Agent, or Firm*—D. L. Hurewitz; J. L. Landis

[57] ABSTRACT

A static logic circuit utilizing transistors of the MOSFET type includes a high resistance load transistor, a low resistance logic network having a large self-loading capacitance, and a gating transistor connected in series between the network and the load device. The logic network controls the output voltage across a load capacitor by grounding the load transistor output for selected input data, and the gating transistor is biased to turn OFF when the voltage across the large self-loading capacitance exceeds a predetermined level, thereafter isolating the input network from the load capacitor and speeding up the output transition by decreasing the time required to charge the load capacitor.

10 Claims, 9 Drawing Figures

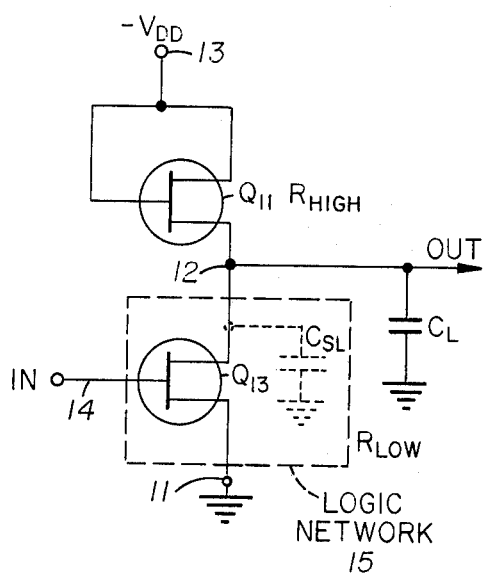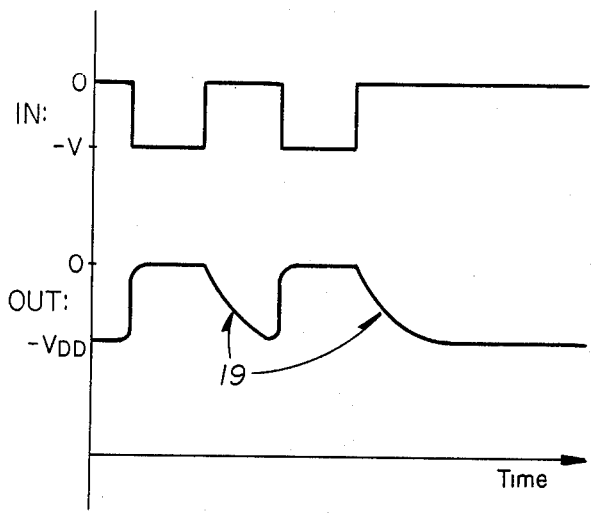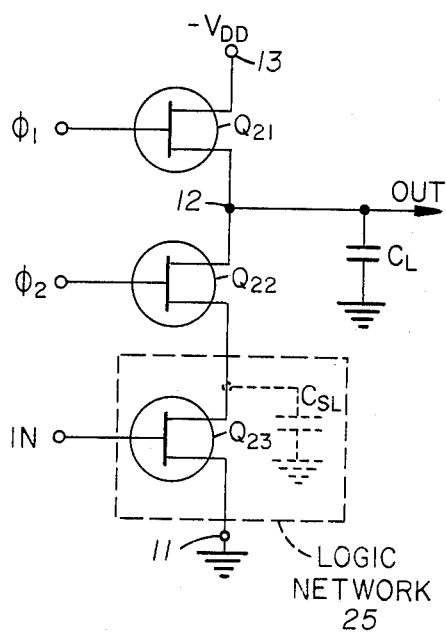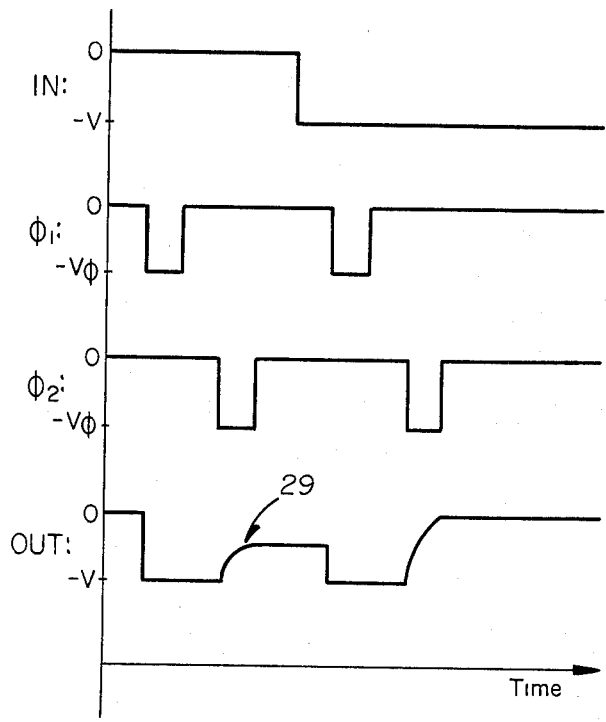

VOLTAGE SENSITIVE ISOLATION FOR STATIC LOGIC CIRCUIT

BACKGROUND OF THE INVENTION

This invention relates to logic circuits, and in particular to a static, ratioed type logic circuit suitable for use with an input logic network having a large self-loading capacitance.

Field-effect transistors are commonly used in logic circuits, and as is well known, the metal-oxide-semiconductor field-effect transistor, hereinafter referred to simply as a "MOSFET", is preferred for many logic circuit applications due primarily to the MOSFET's essentially two dimensional structure which lends itself to high volume fabrication using integrated circuit techniques. The MOSFETS described herein are all assumed to be P-channel, enhancement-mode devices generally of the type described in U.S. Pat. Nos. 3,618,050 and 3,631,465 issued to R. H. Heeren, Nov. 2, 1971 and Dec. 28, 1971, respectively. However, other types of transistors may, of course, be substituted in a straightforward manner if appropriate changes in the biasing are made where necessary.

In one conventional circuit, shown in FIG. 1, a load device, MOSFET $Q_{11}$, functioning as a resistor, applies a dc supply voltage $-V_{DD}$ from supply point 13 to output node 12. A logic network 15, is shown as a single MOSFET $Q_{13}$, but may be any arrangement of series transistors, parallel transistors, or a combination of series and parallel transistors. Network 15 connects output node 12 to a fixed potential reference point 11 (normally ground) and for a given set of input signals applied to the logic network via input lead 14, a conductive path is provided between output node 12 and reference point 11. This grounds the output node, causing the output voltage to go to substantially zero. For all other sets of input signals, an open circuit exists between node 12 and reference point 11, and the output voltage is a negative voltage, $-V$. This output is applied to any appropriate load, but it is most conveniently used to charge a capacitive load $C_L$.

This circuit is a static circuit and is termed ratioed since the control of the output voltage at output node 12 is dependent upon the ratio of the impedance between the load device and the logic network. The resistance of the load device $Q_{11}$ must be many times higher than the resistance of network 15 if node 12 is to be pulled substantially to the potential of reference point 11.

A problem arises where logic network 15 contains a large self-loading capacitance, shown in phantom as $C_{SL}$; this condition exists, for example, where the network is a switch assembly with a large associated wiring capacitance or a large memory structure of, for example, an integrated array of thousands of transistors with its inherent associated capacitances. When the logic network produces a conductive path between reference point 11 and output node 12, the output voltage is established substantially at the reference or ground potential of point 11, and the self-loading capacitance is of no consequence. However, when the logic network creates an open circuit between reference point 11 and output node 12, the load capacitor is essentially connected in parallel with the self-loading capacitance of the logic network, and the two capacitors are therefore charged together. The combined capacitive effect, especially if the self-loading capacitance is large relative to the load capacitor, creates a very long charging time constant and hence a very slow output response time, as shown in FIG. 1A at 19. It is noted that in this figure and in all discussion hereinafter negative logic is assumed; 0 volts corresponds to a logical 0 and a large negative voltage corresponds to a logical 1. Accordingly, a transition from a negative voltage to zero volts at the input 14 of network 15 (corresponding to a change from logical 1 to logical 0) causes a non-conductive path between node 12 and point 11 to be established. This causes $C_L$ to be charged, but as seen at 19, where a large $C_{SL}$ is in parallel with $C_L$, the charging takes place very slowly.

The static ratioed arrangement is, however, not the only type of logic circuit. An alternative configuration, which is inherently faster, utilizes multiphase clock signals to control the circuit operation, rather than relying upon the fixed impedance ratio and changes in the input. This clocking results in a dynamic circuit. As in the static circuits, a logic network creates the open or closed path between a reference point and a common output node in accordance with input data, but clock signals provide the circuit biases instead of dc supplies. Since the circuit operates in response to clocking, the impedance ratio is irrelevant to the operation and these circuits are therefore termed ratioless in distinction to the static ratioed circuits discussed hereinbefore.

There are two possible forms of the basic dynamic logic circuit. Both include an additional gating device connected in series between the logic network and the output node. One arrangement is shown in FIG. 2 and is disclosed in detail in A. S. Farber et. al. U.S. Pat. No. 3,461,312, issued Aug. 12, 1969.

In this circuit MOSFET $Q_{21}$ acts as a load device, and MOSFET $Q_{23}$ and capacitance $C_{SL}$ represent a logic network 25, in a manner similar to the circuit of FIG. 1. A gating MOSFET $Q_{22}$ has been added in series between logic network 25 and output node 12 and the clocking signals $0_1$ and $0_2$ are applied to the gates of MOSFETS $Q_{21}$ and $Q_{22}$ respectively. Reference point 11 and the supply point 13 are again supplied with fixed potential dc voltages, $-V_{DD}$ and ground, respectively. The $0_1$ and $0_2$ clock pulses are provided at mutually exclusive times as shown in FIG. 2A. During the $0_1$ negative interval, the load capacitance $C_L$ is charged regardless of the input since the input is isolated from output node 12, by virtue of $Q_{22}$ being OFF. Therefore, if the logic network has a self-loading capacitance $C_{SL}$, shown in phantom, it would not be charged, but when gating device $Q_{22}$ is turned ON during the $0_2$ negative interval, the self-loading capacitance $C_{SL}$ would share the charge with the capacitive load $C_L$, hence reducing the output voltage. Thus the self-loading capacitance will, if large compared to the capacitive load, essentially dissipate the output voltage as shown at 29 in FIG. 2A. As this is, of course, unacceptable, this prior art dynamic circuit is totally unsuitable for use with input networks having a large self-loading capacitance.

Another dynamic arrangement is shown in FIG. 3 and described in detail, in an article entitled "Multiphase Clocking Achieves 100-Nsec MOS Memory" by Lee Boysel and Joe Murphy in *Electrical Design News* June 10, 1968, page 50.

Referring to FIG. 3, $Q_{31}$ is a load device and $Q_{33}$ and self-loading capacitance $C_{SL}$ represent a logic network 35. The supply voltage at point 13 and the reference potential at point 11 are provided by the $0_1$ clock, shown in FIG. 3A. During the $0_1$ pulse interval load capacitor $C_L$ is charged notwithstanding the input signals since there is no ground path in the system. When the $0_1$ clock pulse is over, the ground is provided, but due to the $0_2$ clock pulse, gating device $Q_{32}$ remains ON. Therefore if the input causes a conductive path from the now grounded reference point 11 to output node 12 through $Q_{32}$, load capacitor $C_L$ will discharge and the output will go to zero. If the input condition produces an open circuit between point 11 and node 12, the charged condition remains and the output stays at the negative output voltage shown as −V in FIG. 3A. Subsequently $Q_{32}$ turns OFF and isolates the input from the output.

The clocking presents numerous constraints upon the circuit design since, of course, the clock signals must be generated and synchronized, and for many applications, the greater simplicity of the static circuit is preferred. Furthermore, this arrangement is not free from the effects of a large self-loading capacitance. If input network 35 contains a large self-loading capacitance $C_{SL}$, shown in phantom, when the charging takes place during the $0_1$ clock pulse interval, the $0_2$ clock is also ON and $Q_{32}$ therefore provides a path to $C_{SL}$ causing both $C_L$ and $C_{SL}$ to charge together as in the static circuit of FIG. 1. This is shown at 39 in FIG. 3A. The result is, of course, a slow charging response time.

In addition, this circuit causes the load capacitor $C_L$ to charge during each $0_1$ pulse interval even if the input conditions corresponds to a zero output, such as at 38, for example. The circuit driven by the output must then also be clocked to sample the output at a time, such as $t_s$, after the $0_2$ pulse.

It is therefore, an object of the present invention to provide a faster operating static logic circuit.

It is a further object to provide a logic circuit which is well suited for operation with a logic network having a large self-loading capacitance.

It is a still further object to provide a logic circuit of the ratioed type which is only superficially affected by the self-loading capacitance of the logic network.

It is a still further object to provide a logic circuit suitable for use with complex logic networks formed by integrated circuit techniques, especially integrated logic networks having small semiconductor areas.

SUMMARY OF THE INVENTION

In accordance with the present invention, the conventional static logic circuit having a high impedance load device and a logic network connected to the load device at an output node is modified by adding a gating device in series between the logic network and the output node. The load device acts as a resistor providing the common node with a fixed dc potential. The gating device is biased so that it will conduct as a function of the voltage at the output of the logic network. In particular, the gating device will turn OFF when the logic network voltage reaches a preselected value less than the circuit output voltage produced at the output node.

This circuit is designed primarily to be useful with logic networks having large self-loading capacitance. As with similar networks having insignificant capacitance the logic network with self-loading capacitance responds to input conditions to provide either an open or closed path from a point of reference potential to the gating device. When the conductive path across the logic network is established, the potential presented to the gating device is low (normally ground) and the gating device conducts, causing the reference potential to appear at the output node. When the logic network establishes an open circuit, the gating device is still conductive and the dc potential from the load device will cause the load capacitor to be charged. The self-loading capacitance of the logic network is, however, essentially in parallel with the load capacitor and will also tend to charge, but when the charge on the self-loading capacitance reaches the preselected level, the gating device will turn OFF, isolating the logic network, and its self-loading capacitance, from the output.

This isolation removes the large parallel self-loading capacitance, thus reducing the effective capacitive load being charged and hence decreasing the charging time. Since the gating device acts as a voltage sensitive isolating switch responsive to the voltage level of the output of the logic network, this circuit is, unlike the dynamic circuits of the prior art, well suited for operation with logic networks having large self-loading capacitance, such as switches having large wiring capacitance or complex logic arrays.

The invention is intended to be embodied using a MOSFET as the gating device, and a suitable logic network is a MOSFET logic circuit such as, for example, a multitransistor memory array. Such an array will have a large effective self-loading capacitance dependent essentially upon the parasitic capacitances of the included MOSFET devices and interconnections. Since the isolation provided by the gating device prevents the complete charging of any self-loading capacitance in the array, the operating voltage of the array is low. This allows the source-to-drain spacings of the included MOSFET devices to be smaller than was previously possible and results in a great reduction of the array area.

BRIEF DESCRIPTION OF THE DRAWINGS

FIG. 1 is a schematic drawing of a prior art static-type ratioed logic circuit;

FIG. 1A is a timing diagram illustrating the operation of the circuit of FIG. 1;

FIG. 2 is a schematic drawing of one type of multiply-clocked logic circuit found in the prior art;

FIG. 2A is a timing diagram illustrating the operation of the circuit in FIG. 2;

DETAILED DESCRIPTION

Figure 3:
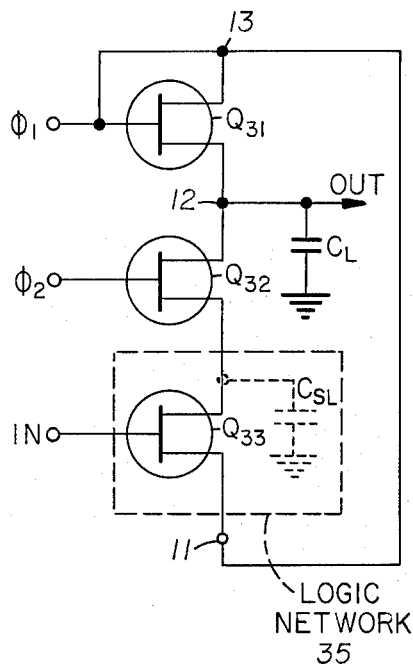
FIG. 3 is a schematic diagram of another type of multiply-clocked logic circuit of the prior art.
Figure 3A:
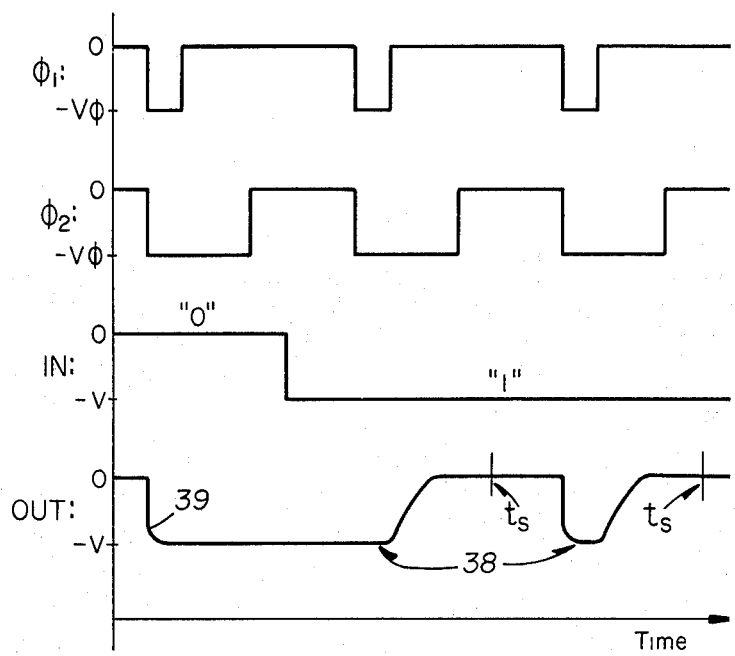
FIG. 3A is a timing diagram illustrating the operation of the circuit of FIG. 3.

Prior art circuits of FIGS. 1 through 3 have been discussed hereinbefore. In each case the operation of the circuit is adversely affected by a large self-loading capacitance of the logic network.

The basic problem caused by the self-loading capacitance is the slow charging exhibited by the parallel combination of the output load capacitor and the self-loading capacitance. This is shown in the static circuit of FIG. 1, and the clocked circuits of FIGS. 2 and 3 do not eliminate the problem. The circuit of FIG. 3 must charge the self-loading capacitor to the full output level as in the static circuit, and the circuit of FIG. 2 suffers from charge sharing between the load capacitor and the self-loading capacitance.

Figure 4:
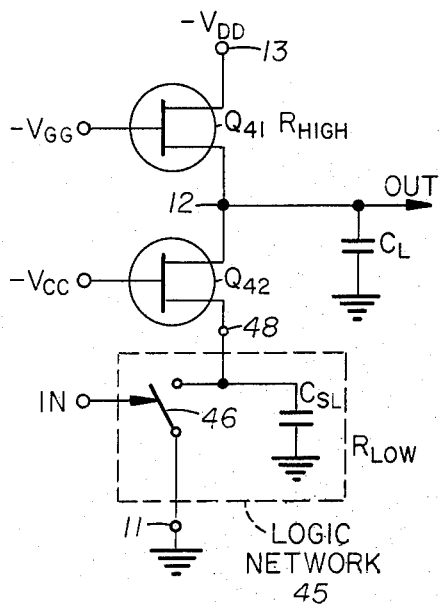
FIG. 4 is a generalized, schematic diagram of the static logic circuit in accordance with the invention.

In distinction, the circuit of FIG. 4 permits large self-loading capacitance without significant ill effects upon the circuit operation. This static circuit includes a load MOSFET $Q_{41}$ which serves as a resistance connecting supply point 13 to the output node 12. The drain of load MOSFET $Q_{41}$ is connected to the supply point 13 which is tied to a negative voltage supply of $-V_{DD}$; the source of $Q_{41}$ is connected to the output node 12 and the gate is connected to a negative voltage supply $-V_{GG}$ which may, in fact, be the same as $-V_{DD}$. Load MOSFET $Q_{41}$ could, of course, be replaced by any of a number of load devices connected between the negative voltage supply $-V_{DD}$ and node 12. For example, a two-terminal device, such as a diffused resistor, an ion implanted resistor, or a discrete resistance, as well as another three-terminal device, such as a depletion mode MOSFET connected to act as resistor, could be substituted for the MOSFET $Q_{41}$.

The logic network 45 is shown as switch 46 and a parallel self-loading capacitor $C_{SL}$. This switch condition is controlled by the condition of the input data to provide either an open or closed conductive path between the reference potential point 11 and the logic network output, point 48. Of course, switch 46 is merely illustrative and may be an individual transistor as in the circuits of FIGS. 1, 2 and 3, if the network 45 is simply an inverter, or it may be a complicated logic arrangement of series, parallel or series and parallel transistors, one example of which will be discussed hereinafter.

The gating device is MOSFET $Q_{42}$. Its drain-source path connects output node 12 and logic network output point 48. Its gate is connected to a negative source of fixed dc potential $-V_{CC}$. The voltage $-V_{CC}$ is established so that its absolute value is less than or equal to the maximum absolute value of the output voltage $-V$ (representing, for example, a logical 1). The voltage $-V$, is equal to the lesser absolute value of either $-V_{DD}$ or $(-V_{GG}-V_{41})$, where $V_{41}$ is a threshold voltage of $Q_{41}$.

The load MOSFET $Q_{41}$ exhibits a resistive impedance typically ten times greater than that of the logic network 45, when network 45 is providing a conductive path between points 48 and 11. This high impedance ratio if necessary to insure a logical 0 output voltage to be substantially a low (ground) output voltage.

In the circuit of FIG. 4 a specified set of input conditions will cause switch 46 to close and other sets will cause switch 46 to open. Since the voltage at point 48 is essentially the low (ground) potential of reference point 11, gating MOSFET $Q_{42}$ is ON when switch 46 is closed; thus the voltage at output node 12 is pulled to the low (ground) potential and $C_L$ is discharged. This is shown at 51 of FIG. 4A.

Upon a change of input conditions, switch 46 is opened. The ground path to point 11 having been removed, load MOSFET $Q_{41}$ charges the output node 12 and $C_L$ toward $-V$. At this time, the voltage at point 48 (shown in FIG. 4A) is essentially zero and hence the gating MOSFET $Q_{42}$ is ON. Therefore, the self-loading capacitance $C_{SL}$ of logic network 45 is in parallel with the load capacitance $C_L$. As a result of this parallel connection, both capacitors ($C_L$ and $C_{SL}$) are charged together. Since $C_{SL}$ may be very large and may, in fact, be many times greater than $C_L$, such as, for example, 100 pfd versus 1 pfd, the combined capacitance creates a very large charging time constant as indicated by the dotted curve 52 superimposed upon the output waveform in FIG. 4A.

Figure 4A:
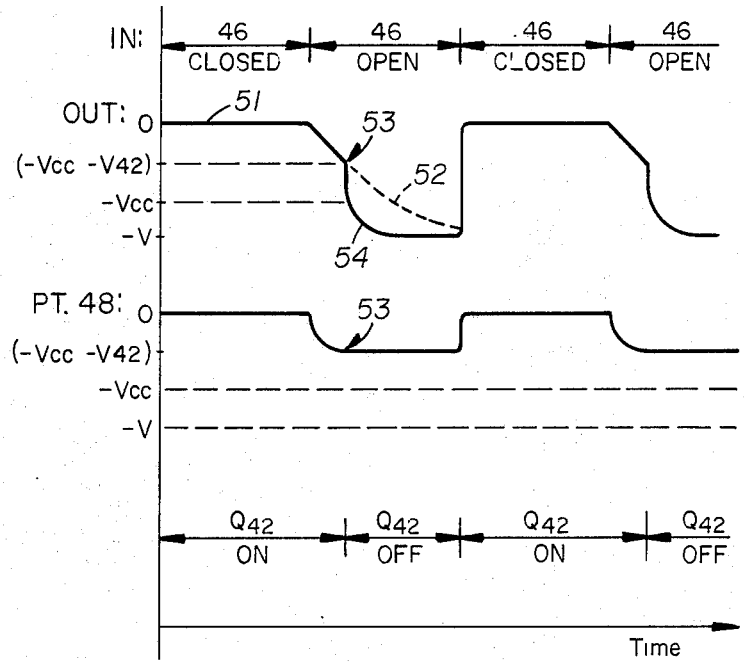
FIG. 4A is a timing diagram illustrating the operation of the invention of FIG. 4.

However, as $C_{SL}$ is charged, its charge voltage increases the absolute value of the voltage at point 48. When the absolute value reaches $(-V_{CC}-V_{42})$, where $V_{42}$ is the threshold voltage of the gating MOSFET $Q_{42}$, $Q_{42}$ turns off, isolating logic network 45 from the output and hence removing $C_{SL}$ from its parallel connection with $C_L$. In FIG. 4A, point 53 represents the turn-OFF of $Q_{42}$. Thereafter (until switch 46 changes state), $C_L$ is charged independently with a much shorter time constant than that associated with curve 52. Hence, the output transition is speeded up as shown by 54 in FIG. 4A after the isolation of the logic network. Since gating MOSFET $Q_{42}$ only turns OFF during the charging of capacitor $C_L$, the gate bias $-V_{CC}$ could, of course, be provided by a clock or logic signal which is at the $-V_{CC}$ level whenever $C_L$ is being charged. Obviously, the maximum advantage of faster speed would occur by choosing a very low absolute value for $-V_{CC}$ so that $(-V_{CC}-V_{42})$ is very close to 0 volts bringing point 53 on the waveforms closer to the change of state of switch 46.

Figure 5:
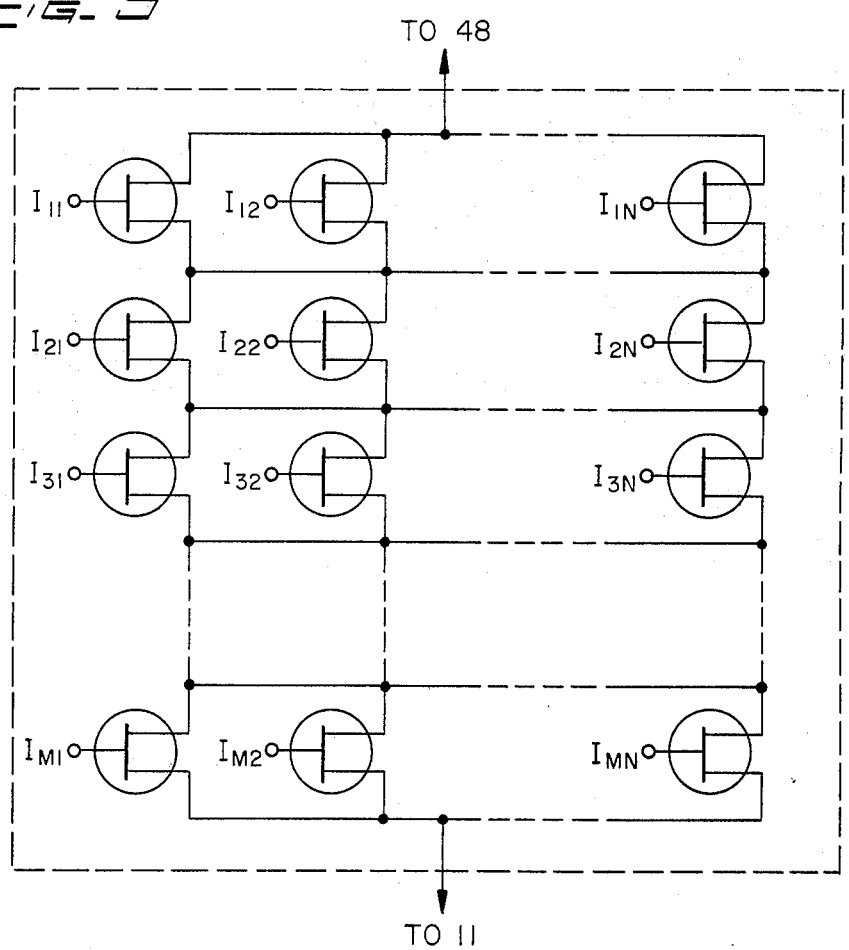
FIG. 5 is a schematic diagram of an input network suitable for use in the circuit of FIG. 4.

Logic network 45 has been illustrated as a simple switch 46 and its associated capacitance $C_{SL}$ which may be wiring capacitance and other inherent capacitances associated with the switch assembly. But it is likely that the network would often be a complex arrangement of semiconductor devices, such as, for example, the array of transistors connected in series-parallel combinations as shown in FIG. 5. Here the plurality of binary inputs $I_{n,m}$ where $n$ equals 1, 2, ... N and $m$ equals 1, 2, ... M; each contribute to the creation of a closed or open path between output point 48 and reference point 11. Notwithstanding the numerous combinations of inputs which will produce the closed conductive path and the numerous combinations of inputs which will provide the open circuit, the path between points 48 and 11 must be either open or closed and thus for any particular set of input conditions, it has been represented simply as a switch 46 in FIG. 4.

In order to increase yields and circuit densities, and hence lower manufacturing costs, smaller semiconductor areas required to integrate a complex logic network are desirable. The area required by the network of FIG. 5 is largely determined by the source-drain spacing of the included MOSFETS. These spacings are in turn determined by the maximum voltage seen by the output node 48. Without the gating device $Q_{42}$, the voltage seen by node 48 would have been $-V$. However adding $Q_{42}$ reduces the voltage seen by node 48 to $(-V_{CC}-V_{42})$ as seen in FIG. 4A, and allows much smaller source-drain spacings, because the minimum source-drain spacing of a MOSFET must be such that the source-drain breakdown voltage is higher than the voltage applied during operation. Hence $Q_{42}$ allows the network of FIG. 5 to be much smaller resulting in higher yield, higher density, and lower manufacturing cost. The lower the absolute value of $-V_{CC}$ is made, the smaller the spacings and the network of FIG. 5 can be.

The isolation provided by the gating device also allows the switch or logic network to be physically separated (at point 48) from the rest of the circuit, such as an integrated circuit containing gating device $Q_{42}$ and load device $Q_{41}$, without severe degradation of switching transitions due to the large capacitance inherently associated with the connection between a remote logic network and the integrated circuit.

Though the devices in the circuit of FIG. 4 are similar to those in the clocked type circuits of FIGS. 2 and 3, the circuit of FIG. 4 operates as an inherently simpler static, ratioed type logic circuit without the complications associated with clocking pulses. In particular, the biases are simply fixed dc voltages instead of clocking pulses and rather than coupling the output node to the logic network in accordance with an external clock, the gating transistor is made responsive to the voltage at the logic network output simply by an appropriate selection of its gate bias level.

In all cases it is to be understood that the above described arrangements are merely illustrative of a small number of the many possible applications of the principles of the present invention. Numerous and varied other arrangements in accordance with these principles may readily be devised by those skilled in the art without departing from the spirit and scope of the invention.

What is claimed is:

1. A static logic circuit comprising:
    an output node having an output capacitance;
    switching means for selectively establishing an essentially short circuit or open circuit between a first point and a reference point of fixed reference potential, the switching means having a self-loading capacitance, large relative to the output capacitance, effectively connected between the first point and the reference point;
    load impedance means having at least first and second electrodes, its first electrode being connected to the output node and its second electrode being connected to a first supply voltage for providing a charging voltage to the output node to charge the output capacitance whenever the switching means establishes an open circuit between the first point and the reference point; and
    gating means for selectively providing a conductive connection between the output node and the first point of the switching means in accordance with the voltage at the first point so that when the switching means establishes a closed circuit, a conductive connection is provided between the output node and the first point, causing the potential at the reference point to appear at the output node; and when the switching means establishes an open circuit, a conductive connection is provided between the output node and the first point, causing the charging voltage applied to the output node to charge the self-loading capacitance to a preselected voltage less than the maximum level of the charging voltage applied to the output node, whereupon a non-conductive connection is provided between the output node and the first point.

2. A static logic circuit as claimed in claim 1 wherein said load impedance means is a field-effect load transistor of the metal-oxide semiconductor type having first and second controlled electrodes and a gate electrode, the first controlled electrode being connected to the output node, the second controlled electrode being connected to the first supply voltage and the gate electrode being connected to a second supply voltage.

3. A static logic circuit as claimed in claim 1 wherein the self-loading capacitance is many times greater than the output capacitance.

4. A static logic circuit as claimed in claim 3 wherein the self-loading capacitance is at least 100 times greater than the load capacitance.

5. A static logic circuit as claimed in claim 1 wherein the switching means includes a memory array of at least thousands of semiconductor devices interconnected in a series-parallel arrangement, the self-loading capacitance being a function of the semiconductor structure.

6. A static logic circuit as claimed in claim 1 wherein said gating means is a field-effect transistor of the metal-oxide-semiconductor type, having first and second controlled electrodes and a gate electrode, the first controlled electrode being connected to said first point, the second controlled electrode being connected to the output node, and the gate electrode being connected to a supply source having a fixed voltage, said fixed voltage being selected so that the absolute value of the fixed voltage less than threshold voltage of the field-effect transistor equals the preselected voltage which is significantly less than the maximum level of the charging voltage applied to the output node.

7. A static logic circuit as claimed in claim 6 wherein said preselected value is chosen as close to the potential at the reference point as practical so that the gating means provides a nonconductive connection between the first point and the output node as soon as the self-loading capacitance begins to charge.

8. A static logic circuit as claimed in claim 6 wherein the gating means produces the nonconductive connection between the output node and the first point to isolate the self-loading capacitance exclusively during the charging of the output capacitance.

9. A logic circuit of a type having an input logic network responsive to a set of input signals for producing at a first point either an essentially short circuit to a reference point of reference potential or an open circuit to the reference point depending upon the set of input signals;
    an output node;
    an output load connected between the output node and the reference point;
    load impedance means having at least two electrodes, said electrodes being connected between a voltage supply and the output node; and
    a field-effect transistor having its drain-source path connected between the first point and the output node
    characterized in that the input logic network exhibits an associated capacitance between the first point and the reference point, high relative to the capacitance of the output node;
    the resistance of the load impedance means being high relative to the resistance of the input logic network when the input logic network produces an essentially short circuit between the first point and the reference point;
    the field-effect transistor having a fixed bias voltage applied to its gate;
    the fixed bias voltage being selected so that when the input logic network produces a short circuit to the first point the reference potential is applied to the output node and whenever the input logic network provides an open circuit to the first point, the load impedance means charges the output load and the load impedance means initially charges the associated capacitance via the drain-source path of the field-effect transistor to a preselected level substantially lower than the maximum voltage provided the output node by the load impedance means, which preselected level turns OFF the field-effect transistor and thereafter isolates the capacitor from the output load until the charge on the associated capacitance goes below the preselected level.

10. A method for selectively isolating an input logic network having a large capacitance associated therewith from the output node of an inverter circuit, said circuit including a load impedance connected to the output node and a gating device connected between the output node and the input logic network;

the ordered steps comprising:

applying input signals to the input logic network to cause it to form an open circuit between a point of reference potential and the gating device;

charging the output node and the associated capacitance in parallel in response to the open circuit of the input logic network;

operating the gating device in response to the charge on the associated capacitance to produce an open circuit between the associated capacitance and the output node when the charge on the associated capacitance reaches a first level relative to the reference potential; and charging the output node, independent of the associated capacitance, to a second level relative to the reference potential substantially greater than the first level.

* * * * *